(12) United States Patent
Wu et al.

(10) Patent No.: US 9,712,124 B2
(45) Date of Patent: Jul. 18, 2017

(54) DISTRIBUTED AMPLIFIER

(71) Applicant: Tsinghua University, Beijing (CN)

(72) Inventors: Huaqiang Wu, Beijing (CN); Hongming Lyu, Beijing (CN); He Qian, Beijing (CN); Zhiping Yu, Beijing (CN); Yilin Huang, Beijing (CN); Jinyu Zhang, Beijing (CN)

(73) Assignee: Tsinghua University, Beijing (CN)

( * ) Notice: Subject to any disclaimer, the term of this patent is extended or adjusted under 35 U.S.C. 154(b) by 0 days.

(21) Appl. No.: 14/798,940

(22) Filed: Jul. 14, 2015

(65) Prior Publication Data

US 2016/0254790 A1    Sep. 1, 2016

(30) Foreign Application Priority Data

Feb. 26, 2015 (CN) .......................... 2015 1 0088636

(51) Int. Cl.
*H03F 3/60* (2006.01)
*H03F 1/56* (2006.01)
(Continued)

(52) U.S. Cl.
CPC ............... *H03F 1/565* (2013.01); *H03F 1/18* (2013.01); *H03F 3/193* (2013.01); *H03F 3/607* (2013.01);
(Continued)

(58) Field of Classification Search
CPC .... H03F 1/565; H03F 3/193; H03F 2200/301; H03F 29/1606; H03F 3/60; H03F 3/601;
(Continued)

(56) References Cited

U.S. PATENT DOCUMENTS

| 4,532,480 A | * | 7/1985 | Gerard | ..................... | H03F 3/607 330/277 |
| 4,540,954 A | * | 9/1985 | Apel | ....................... | H03F 3/607 330/286 |
| 5,177,381 A | * | 1/1993 | Friesen | ................... | H03G 7/001 327/351 |
| 8,076,975 B1 | * | 12/2011 | Lender, Jr. | .............. | H03F 3/607 330/286 |

(Continued)

OTHER PUBLICATIONS

Sui et al., "Multi-Layer Graphene Field-Effect Transistors for Improved Device Performance" Proceedings of IEEE conference on Device Research 2009, University Park, PA, USA.*

(Continued)

*Primary Examiner* — Steven J Mottola
*Assistant Examiner* — Hafizur Rahman
(74) *Attorney, Agent, or Firm* — Kile Park Reed & Houtteman LLC

(57) ABSTRACT

The present disclosure provides a distributed amplifier, including: a drain transmission line; a gate transmission line; GFETs, in which sources of the graphene field-effect transistors are respectively grounded; gates of the graphene field-effect transistors respectively connected with a plurality of first shunt capacitors which are grounded; the gate transmission line is connected with a plurality of first nodes respectively between the gates of the graphene field-effect transistors and the plurality of first shunt capacitors, having a plurality of first inductors respectively between each two first nodes; drains of the graphene field-effect transistors respectively connected with a plurality of second shunt capacitors which are grounded; the drain transmission line is connected with a plurality of second nodes respectively between the drains of the graphene field-effect transistors and the plurality of second shunt capacitors, having a plurality of second inductors respectively between each two second nodes.

7 Claims, 1 Drawing Sheet

(51) Int. Cl.
*H03F 3/193* (2006.01)
*H03F 1/18* (2006.01)

(52) U.S. Cl.
CPC .. *H03F 2200/301* (2013.01); *H03F 2200/451* (2013.01)

(58) Field of Classification Search
CPC .......... H03F 3/602; H03F 3/604; H03F 3/605; H03F 3/607; H01F 1/42; H01L 29/1606; H01L 29/66015; H01L 2924/13088; C01B 31/0438
USPC ..... 330/53, 54, 84, 125, 166, 169, 177, 182, 330/200, 253, 261, 286, 295, 296, 307
See application file for complete search history.

(56) References Cited

U.S. PATENT DOCUMENTS

| | | | |
|---|---|---|---|
| 8,686,790 B2* | 4/2014 | Safavi-Naeini | H03F 1/42 330/286 |
| 9,024,704 B2* | 5/2015 | Shastry | H03H 11/0466 330/286 |
| 2011/0163289 A1* | 7/2011 | Zhu | H01L 21/28255 257/9 |
| 2016/0099684 A1* | 4/2016 | Qiu | H03F 1/0205 330/307 |

OTHER PUBLICATIONS

An et al. "Emerging Nanoelectronic Devices", John Wiley & Sons, Nov. 12, 2014, Table 15.1.*

* cited by examiner

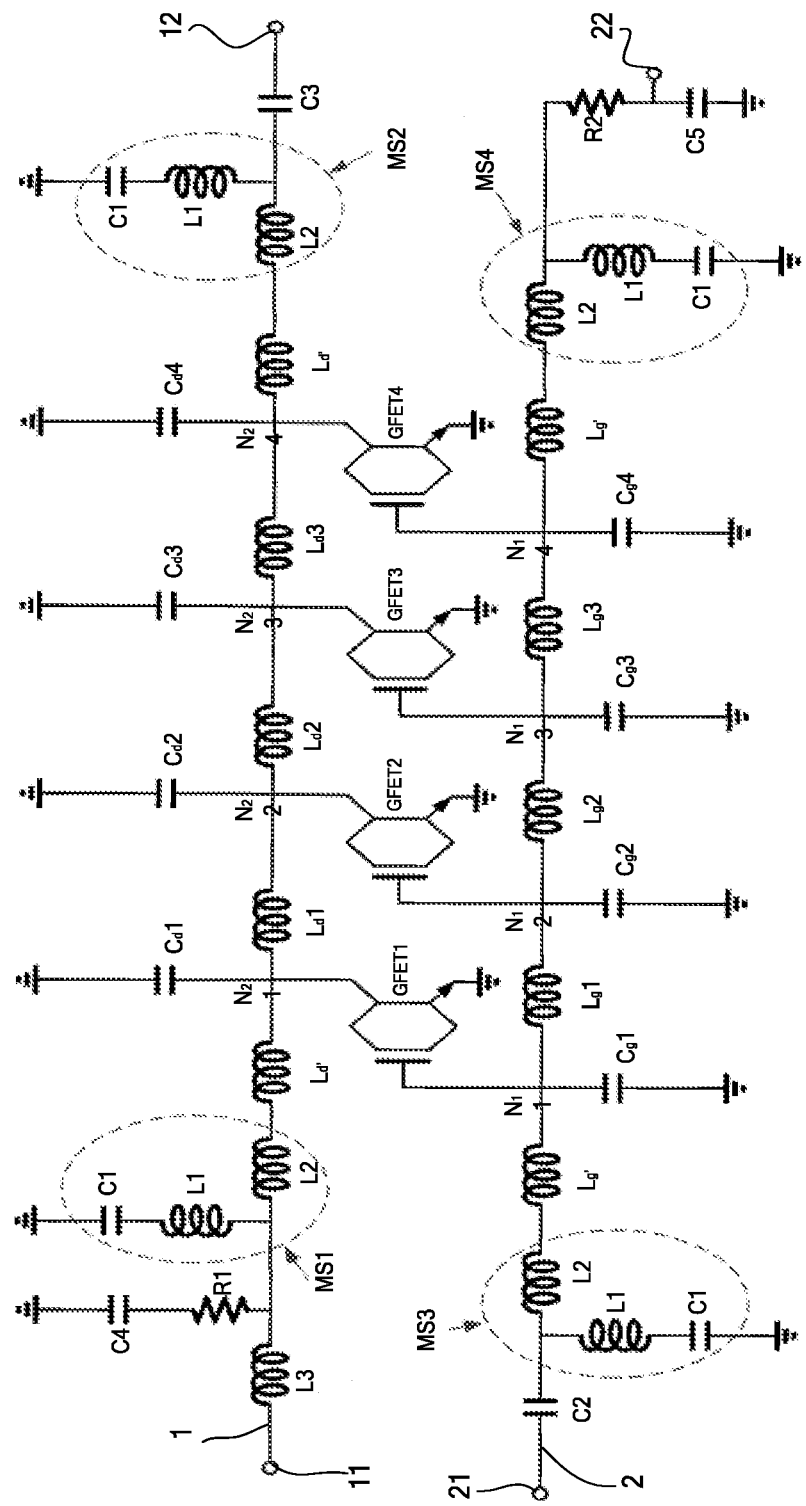

DISTRIBUTED AMPLIFIER

CROSS-REFERENCE TO RELATED APPLICATION

This application claims priority to and benefits of Chinese Patent Application No. 201510088636.0, filed with the State Intellectual Property Office of P. R. China on Feb. 26, 2015, the entire contents of which are incorporated herein by reference.

FIELD

The present disclosure relates to a field of an amplifier, and more particularly relates to a distributed amplifier.

BACKGROUND

Since an emerging material graphene has an ultra-high carrier mobility, the graphene becomes a candidate material for high-frequency electronic devices. However, the graphene is a gapless material, so microwave amplifiers configured with graphene field-effect transistors are difficult to provide an ideal gain.

SUMMARY

The present disclosure aims to provide a distributed amplifier to develop and utilize an amplification capability of graphene field-effect transistors.

According to embodiments of the present disclosure, there is provided a distributed amplifier, including: a drain transmission line, in which the drain transmission line comprises a first matching section at a first end of the drain transmission line and a second matching section at a second end of the drain transmission line, the first end of the drain transmission line is connected with a drain bias voltage, the second end of the drain transmission line is used as an output end of the distributed amplifier; a gate transmission line, in which the gate transmission line comprises a third matching section at a first end of the gate transmission line and a fourth matching section at a second end of the gate transmission line, the first end of the gate transmission line is used as an input end of the distributed amplifier, and the second end of the gate transmission line is connected with a gate bias voltage; graphene field-effect transistors, in which the graphene field-effect transistors are identical and are arranged sequentially to form GFET stages; sources of the graphene field-effect transistors are respectively grounded; gates of the graphene field-effect transistors respectively connected with a plurality of first shunt capacitors which are grounded; the gate transmission line is connected with a plurality of first nodes respectively between the gates of the graphene field-effect transistors and the plurality of first shunt capacitors, having a plurality of first inductors respectively between each two first nodes; drains of the graphene field-effect transistors respectively connected with a plurality of second shunt capacitors which are grounded; the drain transmission line is connected with a plurality of second nodes respectively between the drains of the graphene field-effect transistors and the plurality of second shunt capacitors, having a plurality of second inductors respectively between each two second nodes. The gate transmission line and drain transmission line are synchronized.

With a distributed amplifier according to embodiments of the present disclosure, a performance of the distributed amplifier according to embodiments of the present disclosure is better than a performance of an amplifier with a single graphene field-effect transistor, and the bandwidth is improved. The gain of the distributed amplifier is in an additive manner. An output voltage of the distributed amplifier is proportional to the number of the graphene field-effect transistors, such that it is easy to obtain a gain by this distributed amplifier.

In some embodiments, if an input voltage of the distributed amplifier is constant, an output voltage of the distributed amplifier is proportional to a number of the graphene field-effect transistors.

In some embodiments, the first matching section, the second matching section, the third matching section and the fourth matching section are identical and are used to reduce the peaking effect.

In some embodiments, each of the first matching section, the second matching section, the third matching section and the fourth matching section includes a first capacitor, a third inductor and a fourth inductor; in which the first capacitor, the third inductor and the fourth inductor are connected in series, and the first capacitor is grounded.

In some embodiments, a second capacitor is arranged between the input end of the distributed amplifier and the third matching section, and a third capacitor is arranged between the output end of the distributed amplifier and the second matching section.

In some embodiments, a drain bias section is arranged between the first end of the drain transmission line and the first matching section and the drain bias section includes: a fourth capacitor, in which a first end of the fourth capacitor is grounded; a first resistor, in which a first end of the first resistor is connected with a second end of the fourth capacitor; a fifth inductor, in which a first end of the fifth inductor is connected with the first end of the drain transmission line, and a second end of the fifth inductor is connected with a second end of the first resistor, and the first matching section is connected with a node between the fifth inductor and the first resistor.

In some embodiments, a gate bias section is arranged between the second end of the gate transmission line and the fourth matching section and the gate bias section includes: a fifth capacitor, in which a first end of the fifth capacitor is grounded; a second resistor, in which a first end of the second resistor is connected with a second end of the fifth capacitor, a node between the second resistor and the fifth capacitor is connected with the second end of the gate transmission line, and a second end of the second resistor is connected with the fourth matching section.

In some embodiments, instead of lumped components (inductors and capacitors), transmission lines can be employed between each GFET stage.

It is to be understood that both the foregoing general description and the following detailed description are exemplary and explanatory only and are not restrictive of the invention, as claimed.

BRIEF DESCRIPTION OF THE DRAWINGS

In order to explicitly illustrate embodiments of the present disclosure, a brief introduction for the accompanying drawings corresponding to the embodiments will be listed as follows. Apparently, the drawings described below are only corresponding to some embodiments of the present disclosure, and those skilled in the art may obtain other drawings according to these drawings without creative labor.

The FIGURE is a schematic diagram illustrating a distributed amplifier according to an exemplary embodiment.

Embodiments of the present disclosure have already been illustrated with reference to above drawings, and will be described more detail in the following description. These drawings and text description are not intended to limit the scope of the present disclosure in any way, but are used to explain the concept of the present disclosure to those skilled in the art with reference to special embodiments.

DETAILED DESCRIPTION

Reference will be made in detail to embodiments of the present disclosure. The embodiments described herein with reference to drawings are explanatory, illustrative, and used to generally understand the present disclosure. The embodiments shall not be construed to limit the present disclosure. The same or similar elements and the elements having same or similar functions are denoted by like reference numerals throughout the descriptions.

The FIGURE is a schematic diagram illustrating a distributed amplifier according to an exemplary embodiment of the present disclosure. As shown in the FIGURE, the distributed amplifier according to embodiments of the present disclosure includes a drain transmission line 1, a gate transmission line 2, a graphene field-effect transistor GFET1, a graphene field-effect transistor GFET2, a graphene field-effect transistor GFET3 and a graphene field-effect transistor GFET4. It should be noted that, four graphene field-effect transistors in this embodiment only are illustrated as an example, and a number of the graphene field-effect transistors may be determined according to requirements and is not limited in embodiments of the present disclosure.

Specifically, a first end 11 of the drain transmission line 1 is connected with a drain bias voltage, a second end 12 of the drain transmission line 1 is used as an output end of the distributed amplifier, the drain transmission line 1 comprises a first matching section MS1 at the first end 11 of the drain transmission line 1 and a second matching section MS2 at the second end 12 of the drain transmission line 1.

A first end 21 of the gate transmission line 2 is used as an input end of the distributed amplifier, a second end 22 of the gate transmission line 2 is connected with a gate bias voltage, the gate transmission line 2 comprises a third matching section MS3 at the first end 21 of the gate transmission line 2 and a fourth matching section MS4 at the second end 22 of the gate transmission line 2.

The graphene field-effect transistors GFET1-GFET4 are identical and are arranged sequentially to form GFET stages. Sources of the graphene field-effect transistors GFET1-GFET4 are respectively grounded, gates of the graphene field-effect transistors GFET1-GFET4 respectively connected with a plurality of first shunt capacitors $C_g1$-$C_g4$ which are grounded. The gate transmission line 2 is connected with a plurality of first nodes $N_11$-$N_14$ respectively between the gates of the graphene field-effect transistors GFET1-GFET4 and the plurality of first shunt capacitors $C_g1$-$C_g4$, having a plurality of first inductors $L_g1$-$L_g3$ respectively between each two first nodes. Drains of the graphene field-effect transistors GFET1-GFET4 respectively connected with a plurality of second shunt capacitors $C_d1$-$C_d4$ which are grounded. The drain transmission line 1 is connected with a plurality of second nodes $N_21$-$N_24$ respectively between the drains of the graphene field-effect transistors GFET1-GFET4 and the plurality of second shunt capacitors $C_d1$-$C_d4$, having a plurality of second inductors $L_d1$-$L_d3$ respectively between each two second nodes.

For example, a gate of the grapheme field transistor GFET1 is connected with a first shunt capacitor $C_g1$ which is grounded, the gate transmission line 2 is connected with a first node $N_11$ between the gate of the grapheme field transistor GFET1 and the first shunt capacitor $C_g1$, a gate of the grapheme field transistor GFET2 is connected with a first shunt capacitor $C_g2$ which is grounded, the gate transmission line 2 is connected with a first node $N_12$ between the gate of the grapheme field transistor GFET2 and the first shunt capacitor $C_g2$, and the gate transmission line 2 comprises a first inductor $L_g1$ between the first node $N_11$ and the first node $N_12$.

A drain of the grapheme field transistor GFET1 is connected with a second shunt capacitor $C_d1$ which is grounded, the drain transmission line 1 is connected with a second node $N_21$ between the drain of the grapheme field transistor GFET1 and the second shunt capacitor $C_d1$, a drain of the grapheme field transistor GFET2 is connected with a second shunt capacitor $C_d2$ which is grounded, the drain transmission line 1 is connected with a second node $N_22$ between the drain of the grapheme field transistor GFET2 and the second shunt capacitor $C_d2$, and the drain transmission line 1 comprises a second inductor $L_d1$ between the second node $N_21$ and the second node $N_22$.

In an embodiment, as shown in the FIGURE, the inductances of the plurality of first inductors $L_g1$-$L_g3$ are same and the inductances of the plurality of second inductors $L_d1$-$L_d3$ are same. And, an inductor $L_{g'}$ with half of the inductance of a first inductor is arranged between the third matching section MS3 and the first node $N_11$. An inductor $L_{g'}$ with half of the inductance of a first inductor is arranged between the fourth matching section MS4 and the first node $N_14$. An inductor $L_{d'}$ with half of the inductance of a second inductor is arranged between the first matching section MS1 and the second node $N_21$. An inductor $L_{d'}$ with half of the inductance of a second inductor is arranged between the second matching section MS2 and the second node $N_24$.

In some embodiments, if an input voltage of the distributed amplifier is constant, an output voltage of the distributed amplifier is proportional to a number of the graphene field-effect transistors.

In some embodiments, the first matching section MS1, the second matching section MS2, the third matching section MS3 and the fourth matching section MS4 are used to reduce the peaking effect.

In some embodiments, each of the first matching section MS1, the second matching section MS2, the third matching section MS3 and the fourth matching section MS4 includes a first capacitor C1, a first inductor L1 and a second inductor L2. The first capacitor, the third inductor and the fourth inductor are connected in series, and the first capacitor is grounded. More specifically, a node between the third inductor and the fourth inductor in the first matching section MS1 is used as the first end 11 of the drain transmission line 1. A node between the third inductor and the fourth inductor in the second matching section MS2 is used as the second end 12 of the drain transmission line 1. A node between the third inductor and the fourth inductor in the third matching section MS3 is used as the first end 21 of the gate transmission line 2. A node between the third inductor and the fourth inductor in the fourth matching section MS2 is used as the second end 22 of the gate transmission line 2.

In some embodiments, a second capacitor C2 is arranged between the input end (i.e. the first end 21 of the gate transmission line 2) of the distributed amplifier and the third matching section MS3, and a third capacitor C3 is arranged between the output end (i.e. the second end 12 of the drain transmission line 1) of the distributed amplifier and the second matching section MS2. The second capacitor C2 and the third capacitor C3 are used to block DC.

In some embodiments, a drain bias section is arranged between the first end of the drain transmission line and the first matching section and the drain bias section includes: a fourth capacitor C4, a first resistor R1 and a fifth inductor L3. A first end of the fifth capacitor C5 is grounded, a first end of the first resistor R1 is connected with a second end of the fourth capacitor C4, a first end of the fifth inductor L3 is connected with the first end 11 of the drain transmission line 1, and a second end of the fifth inductor L3 is connected with a second end of the first resistor R1, and the first matching section is connected with a node between the fifth inductor L3 and the first resistor R1.

In some embodiments, a gate bias section is arranged between the second end of the gate transmission line and the fourth matching section and the gate bias section includes a fifth capacitor C5 and a second resistor R2. A first end of the fifth capacitor C5 is grounded, a first end of the second resistor R2 is connected with a second end of the fifth capacitor C5, a node between the second resistor R2 and the fifth capacitor C5 is connected with the second end 22 of the gate transmission line 2, and a second end of the second resistor R2 is connected with the fourth matching section.

This present disclosure demonstrates a feasibility of a graphene distributed amplifier. In the above-described graphene distributed amplifier, since lumped-element transmission lines are periodically incorporated in a load with the graphene field-effect transistors, a lossy transmission line structure is formed. The resultant effective input and output transmission structures are referred to the gate transmission line and drain transmission line. A RF (Radio frequency) signal provided at the input end of the gate transmission line travels along the gate transmission line to the other end of the gate transmission line, and then it is absorbed by the terminating impedance. However, the signals sampled by the gates of GFETs at different locations (hence the signals have different phases) are amplified through the GFET transconductance. Therefore, if the phase velocity of the signal at the drain transmission line is equal to that at the gate transmission line, the signals on the drain transmission line are added for the forward-traveling direction. The backward-traveling signals on the drain transmission line are absorbed by the fore-end of the drain transmission line.

The gate transmission line consists of the second shunt capacitors $C_g$s at the gates of the transistors and the second inductors $L_g$s between the GFET stages. Then the characteristic impedance of the gate transmission line is defined as $$Z_g \approx \sqrt{\frac{L_g}{C_g + C_{gg}}},$$

where $C_{gg}$ represents the gate capacitance of a GFET, $L_g$ represents the inductance of a second inductor, and $C_g$ represents the capacitance of a second shunt capacitor. Likely, the drain transmission line consists of the first capacitors $C_d$s at the drains to shunt the first inductors $L_d$s. The two transmission lines have identical velocities of propagation by adjusting the first inductors, the second inductors, the first capacitors and the second capacitors. Therefore, the forward-traveling waves on the drain transmission line are added in phase. Thus, the output voltage is proportional to the number of graphene field-effect transistors.

In summary, with a distributed amplifier according to embodiments of the present disclosure, a performance of the distributed amplifier according to embodiments of the present disclosure is better than a performance of an amplifier with a single graphene field-effect transistor, and a bandwidth is improved. Further, since this distributed amplifier adopts a superposition principle instead of a conventional non-overlapping principle, an output voltage of the distributed amplifier is proportional to the number of the graphene field-effect transistors, such that it is easy to obtain a gain by this distributed amplifier.

In addition, terms such as "first" and "second" are used herein for purposes of description and are not intended to indicate or imply relative importance or significance. Thus, the feature defined with "first" and "second" may comprise one or more this feature. In the description of the present disclosure, "a plurality of" means two or more than two, unless specified otherwise.

In the description of the present disclosure, it should be understood that, unless specified or limited otherwise, the terms "mounted," "connected," and "coupled" and variations thereof are used broadly and encompass such as mechanical or electrical mountings, connections and couplings, also can be inner mountings, connections and couplings of two components, and further can be direct and indirect mountings, connections, and couplings, which can be understood by those skilled in the art according to the detail embodiment of the present disclosure.

In the description of the present disclosure, a structure in which a first feature is "on" a second feature may include an embodiment in which the first feature directly contacts the second feature, and may also include an embodiment in which an additional feature is formed between the first feature and the second feature so that the first feature does not directly contact the second feature, unless specified otherwise. Furthermore, a first feature "on," "above," or "on top of" a second feature may include an embodiment in which the first feature is right "on," "above," or "on top of" the second feature, and may also include an embodiment in which the first feature is not right "on," "above," or "on top of" the second feature, or just means that the first feature is at a height higher than that of the second feature. While a first feature "beneath," "below," or "on bottom of" a second feature may include an embodiment in which the first feature is right "beneath," "below," or "on bottom of" the second feature, and may also include an embodiment in which the first feature is not right "beneath," "below," or "on bottom of" the second feature, or just means that the first feature is at a height lower than that of the second feature.

Reference throughout this specification to "an embodiment," "some embodiments," "one embodiment", "another example," "an example," "a specific example," or "some examples," means that a particular feature, structure, material, or characteristic described in connection with the embodiment or example is included in at least one embodiment or example of the present disclosure. Thus, the appearances of the phrases such as "in some embodiments," "in one embodiment", "in an embodiment", "in another example," "in an example," "in a specific example," or "in some examples," in various places throughout this specification are not necessarily referring to the same embodiment or example of the present disclosure. Furthermore, the particular features, structures, materials, or characteristics may be combined in any suitable manner in one or more embodiments or examples.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A distributed amplifier, comprising:
a drain transmission line, wherein the drain transmission line comprises a first matching section at a first end of the drain transmission line and a second matching section at a second end of the drain transmission line, the first end of the drain transmission line is connected with a drain bias voltage, the second end of the drain transmission line is used as an output end of the distributed amplifier;
a gate transmission line, wherein the gate transmission line comprises a third matching section at a first end of the gate transmission line and a fourth matching section at a second end of the gate transmission line, the first end of the gate transmission line is used as an input end of the distributed amplifier, and the second end of the gate transmission line is connected with a gate bias voltage;
graphene field-effect transistors,
in which the graphene field-effect transistors are identical and are arranged sequentially to form GFET stages; sources of the graphene field-effect transistors are respectively grounded;
gates of the graphene field-effect transistors respectively connected with a plurality of first shunt capacitors which are grounded; the gate transmission line is connected with a plurality of first nodes respectively between the gates of the graphene field-effect transistors and the plurality of first shunt capacitors, having a plurality of first inductors respectively between each two first nodes; drains of the graphene field-effect transistors respectively connected with a plurality of second shunt capacitors which are grounded; the drain transmission line is connected with a plurality of second nodes respectively between the drains of the graphene field-effect transistors and the plurality of second shunt capacitors, having a plurality of second inductors respectively between each two second nodes.

2. The distributed amplifier according to claim 1, wherein if an input voltage of the distributed amplifier is constant, an output voltage of the distributed amplifier is proportional to a number of the graphene field-effect transistors.

3. The distributed amplifier according to claim 1, wherein the first matching section, the second matching section, the third matching section and the fourth matching section are identical and are used to reduce a peaking effect.

4. The distributed amplifier according to claim 3, wherein each of the first matching section, the second matching section, the third matching section and the fourth matching section comprises a first capacitor, a third inductor and a fourth inductor; wherein the first capacitor, the third inductor and the fourth inductor are connected in series, and the first capacitor is grounded.

5. The distributed amplifier according to claim 1, wherein a second capacitor is arranged between the input end of the distributed amplifier and the third matching section, and a third capacitor is arranged between the output end of the distributed amplifier and the second matching section.

6. The distributed amplifier according to claim 1, wherein a drain bias section is arranged between the first end of the drain transmission line and the first matching section and the drain bias section comprises:
a fourth capacitor, in which a first end of the fourth capacitor is grounded;
a first resistor, in which a first end of the first resistor is connected with a second end of the fourth capacitor;
a fifth inductor, in which a first end of the fifth inductor is connected with the first end of the drain transmission line, and a second end of the fifth inductor is connected with a second end of the first resistor, and the first matching section is connected with a node between the fifth inductor and the first resistor.

7. The distributed amplifier according to claim 1, wherein a gate bias section is arranged between the second end of the gate transmission line and the fourth matching section and the gate bias section comprises:
a fifth capacitor, in which a first end of the fifth capacitor is grounded;
a second resistor, in which a first end of the second resistor is connected with a second end of the fifth capacitor, a node between the second resistor and the fifth capacitor is connected with the second end of the gate transmission line, and a second end of the second resistor is connected with the fourth matching section.

* * * * *